United States Patent [19]

Hueber

[11] Patent Number: 4,790,019

[45] Date of Patent: Dec. 6, 1988

[54] REMOTE HEARING AID VOLUME CONTROL

[75] Inventor: Fritz Hueber, Vienna, Austria

[73] Assignee: Viennatone Gesellschaft m.b.H., Vienna, Austria

[21] Appl. No.: 752,909

[22] Filed: Jul. 8, 1985

[30] Foreign Application Priority Data

Jul. 18, 1984 [AT] Austria .................................. 2329/84

[51] Int. Cl.$^4$ ........................ H04R 25/00; H03G 3/02
[52] U.S. Cl. ............................. 381/68.4; 340/825.68; 340/825.75; 381/105; 455/352; 455/355
[58] Field of Search ........ 179/107 FD, 107 E, 107 R, 179/2 A; 340/825.68, 825.75; 381/68, 68.1–68.7, 105, 104; 455/351–352, 355

[56] References Cited

U.S. PATENT DOCUMENTS

| | | | |
|---|---|---|---|
| 3,046,798 | 7/1962 | Igarashi .............................. | 455/232 |
| 3,510,777 | 5/1970 | Gordon .......................... | 340/825.68 |
| 3,973,241 | 8/1976 | Streckenbach et al. ........ | 340/825.68 |
| 4,121,198 | 10/1978 | Tsuboi et al. .................. | 340/825.75 |
| 4,198,620 | 4/1980 | Vogt et al. ...................... | 340/825.75 |
| 4,208,654 | 6/1980 | Vogt et al. .......................... | 340/351 |
| 4,334,315 | 6/1982 | Ono et al. .......................... | 455/100 |
| 4,628,907 | 12/1986 | Epley ................................... | 381/68.3 |

FOREIGN PATENT DOCUMENTS

| | | |
|---|---|---|
| 1938381 | 2/1971 | Fed. Rep. of Germany . |
| 2407726 | 8/1975 | Fed. Rep. of Germany . |
| 3205686 | 8/1983 | Fed. Rep. of Germany . |
| 3431584 | 3/1986 | Fed. Rep. of Germany ........ 381/68 |
| 3527112 | 1/1987 | Fed. Rep. of Germany ........ 381/68 |
| 659728 | 1/1964 | Italy ...................................... 381/68 |
| 1252411 | 11/1971 | United Kingdom ................. 381/68 |
| 1565701 | 4/1980 | United Kingdom ............ 179/107 R |

OTHER PUBLICATIONS

"Special Hearing System", *Sound and Communications*, Sep. 1982, p. 12.

Primary Examiner—Jin F. Ng
Assistant Examiner—Danita R. Byrd
Attorney, Agent, or Firm—Kurt Kelman

[57] ABSTRACT

A hearing aid comprises a microphone, a battery-operated earphone, and amplifying circuit connected to the microphone output, the amplifying circuit including a frequency-selective circuit component and a sound level adjustment circuit component connected to the frequency-selective circuit component, and a remote sound wave control signal emitter circuit separate from the microphone, earphone and amplifying circuit and emitting sound wave control signals within the range of the microphone input.

17 Claims, 7 Drawing Sheets

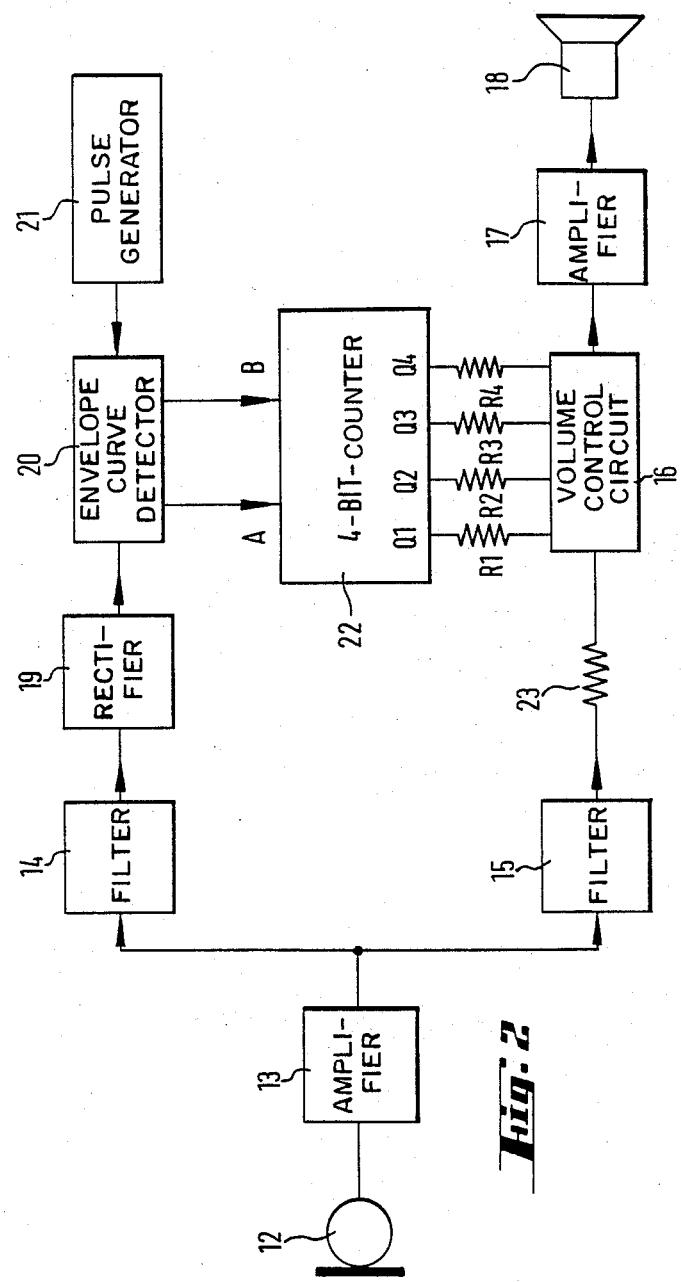
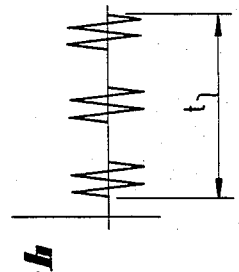
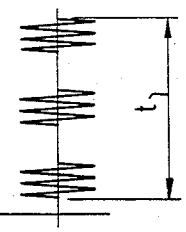

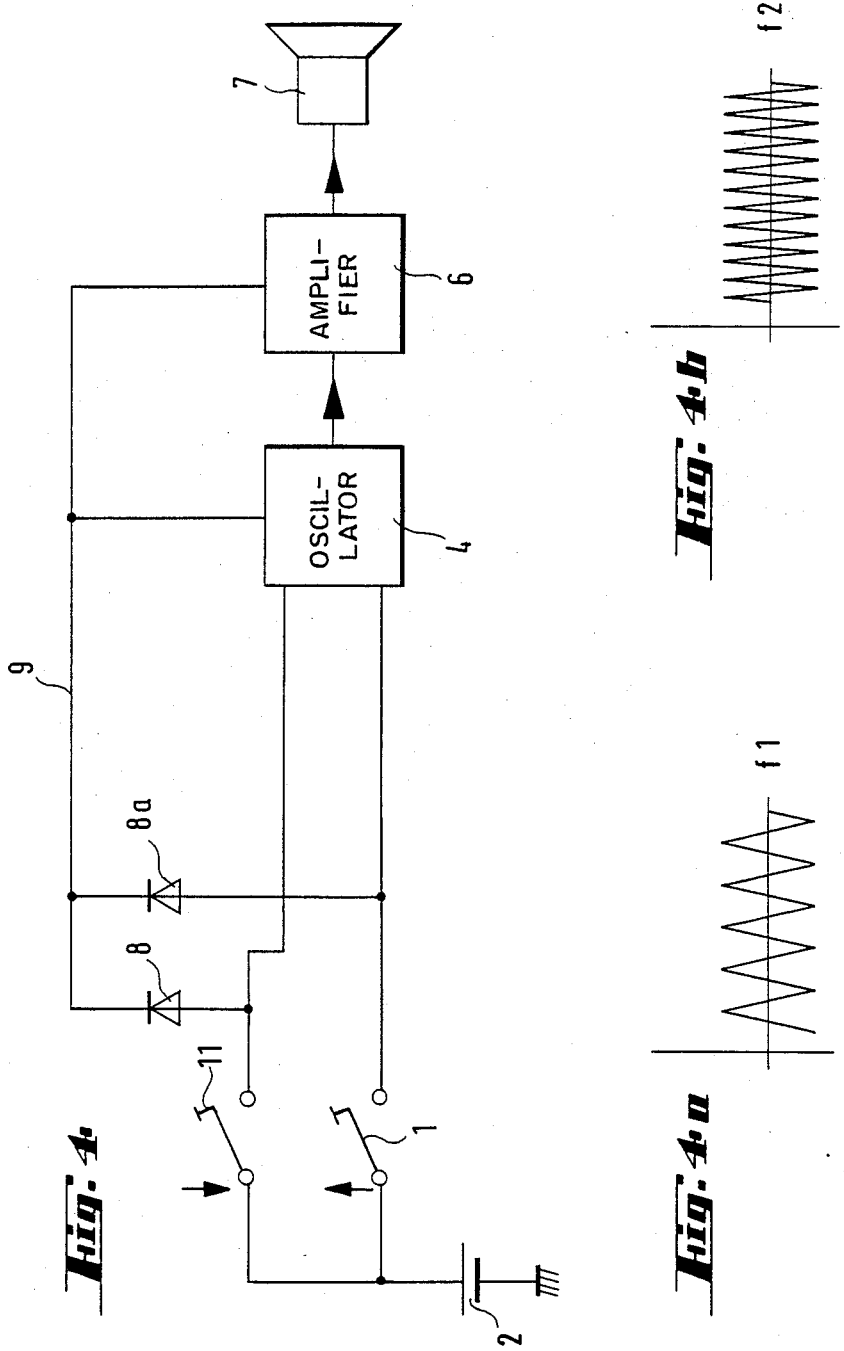

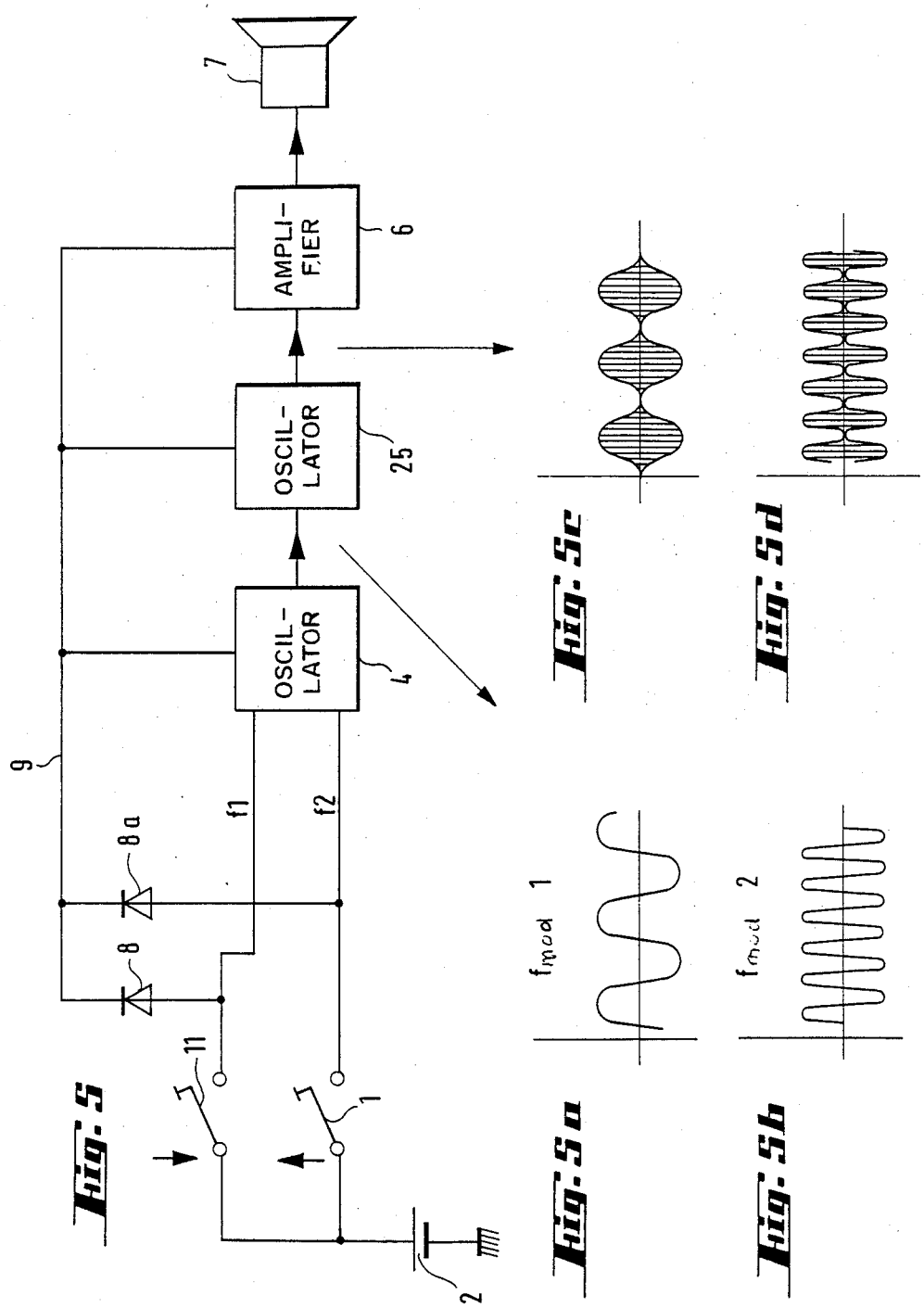

REMOTE HEARING AID VOLUME CONTROL

BACKGROUND OF THE INVENTION (1) Field of the Invention

The present invention relates to a volume control for an in-car hearing aid comprising a microphone having an input and an output for receiving and transmitting sound wave signals, a battery-operated earphone and an amplifying circuit connected to the microphone output, the amplifying circuit including a sound level adjustment circuit component.

(2) Description of the Related Art

In the last few years, hearing aids worn on the head of the hard-of-hearing have become smaller and smaller. Progress in the technology of producing hearing aid components has made it possible to reduce the size of the housing of conventional hearing aids worn behind the ear. Nowadays, housing of hearing aids may be built so small that they may be worn even in the ear or the ear canal.

The progressive reduction in the size of the housing of hearing aids has made it necessary to miniaturize the operating elements of the hearing aid, such as switches and sound level adjustments, correspondingly. This has led to adjustment wheels for the adjustment of potentiometers used conventionally for the regulation of the sound level that are so small that they can be manipulated only with considerable difficulty, if at all, by older persons who are hard-of-hearing and whose finger motion ability has often been diminished by age-connected disabilities.

SUMMARY OF THE INVENTION

It is accordingly a primary object of this invention to provide a hearing aid of the indicated type whose sound level adjustment may be easily operated, the required operation of the sound level adjustment elements requiring only a minimal manual motor ability.

The above and other objects are accomplished according to the invention by including a frequency-selective circuit component in the amplifying circuit and connecting the sound level adjustment circuit component to the frequency-selective circuit component. In addition, a remote sound wave control signal emitter separate from the microphone, earphone and amplifying circuit of the hearing aid is provided to emit sound wave control signals within the range of the hearing aid microphone input. The amplifying circuit may include a pre-amplifier between the microphone output and the frequency-selective circuit component.

In this remote sound volume control arrangement, no adjustment elements for the sound level regulation as well as for other control functions, such as the switching on and off of the hearing aid or the operation of an optional tone control circuit, are required in the in-ear hearing aid proper. These adjustment elements can be combined with the remote sound wave control signal emitter in a structural unit or module which may be carried, for example, in the pocket of the clothing of the hard-of-hearing person. The adjustment elements may be keys for operating the sound wave control signal emitter by depressing the keys, the in-ear hearing aid proper including a circuit responsive to the control signals transmitted by the emitter and correspondingly controlling the sound level adjustment, the tone control circuit and the entire circuitry of the in-ear hearing aid proper.

Remote control of television receivers, hi-fi receivers and the like by high-frequency, infrared or ultra-sound wave emitters is well known to control such functions as channel selection, sound level, brightness, color quality and the like. However, this remote control technology cannot be used for in-ear hearing aids because the required circuitry is much too complicated and voluminous for such instruments. For example, the conventional remote control circuits require a special receiving component in the apparatus to be controlled for reception of the control signals from the remote control emitter, which is avoided in the circuit used in the present invention.

BRIEF DESCRIPTION OF THE DRAWING

The above and other objects, advantages and features of this invention will become more apparent from the following detailed description of certain now preferred embodiments thereof, taken in conjunction with the accompanying drawing wherein FIG. 1 schematically shows a circuit diagram of an embodiment of the sound wave control signal emitter for the remote control of the in-ear hearing aid;

FIG. 2 schematically shows a circuit diagram of a hearing aid with the remote control of the invention;

FIGS. 3a and 3b illustrate control signal trains which may be generated by a different embodiment of the sound wave control signal emitter;

FIG. 4 shows an embodiment of a signal emitter with two frequencies;

FIGS. 4a and 4b show respective frequencies at which the emitter of FIG. 4 may be operated;

FIG. 5 shows an embodiment of a signal emitter with reversible modulation;

FIG. 5a shows a low modulation frequency generated by the emitter of FIG. 5 and FIG. 5c shows the carrier modulated thereby;

FIG. 5b shows a high modulation frequency generated by the emitter of FIG. 5 and FIG. 5d shows the carrier modulated thereby;

Figure 1:
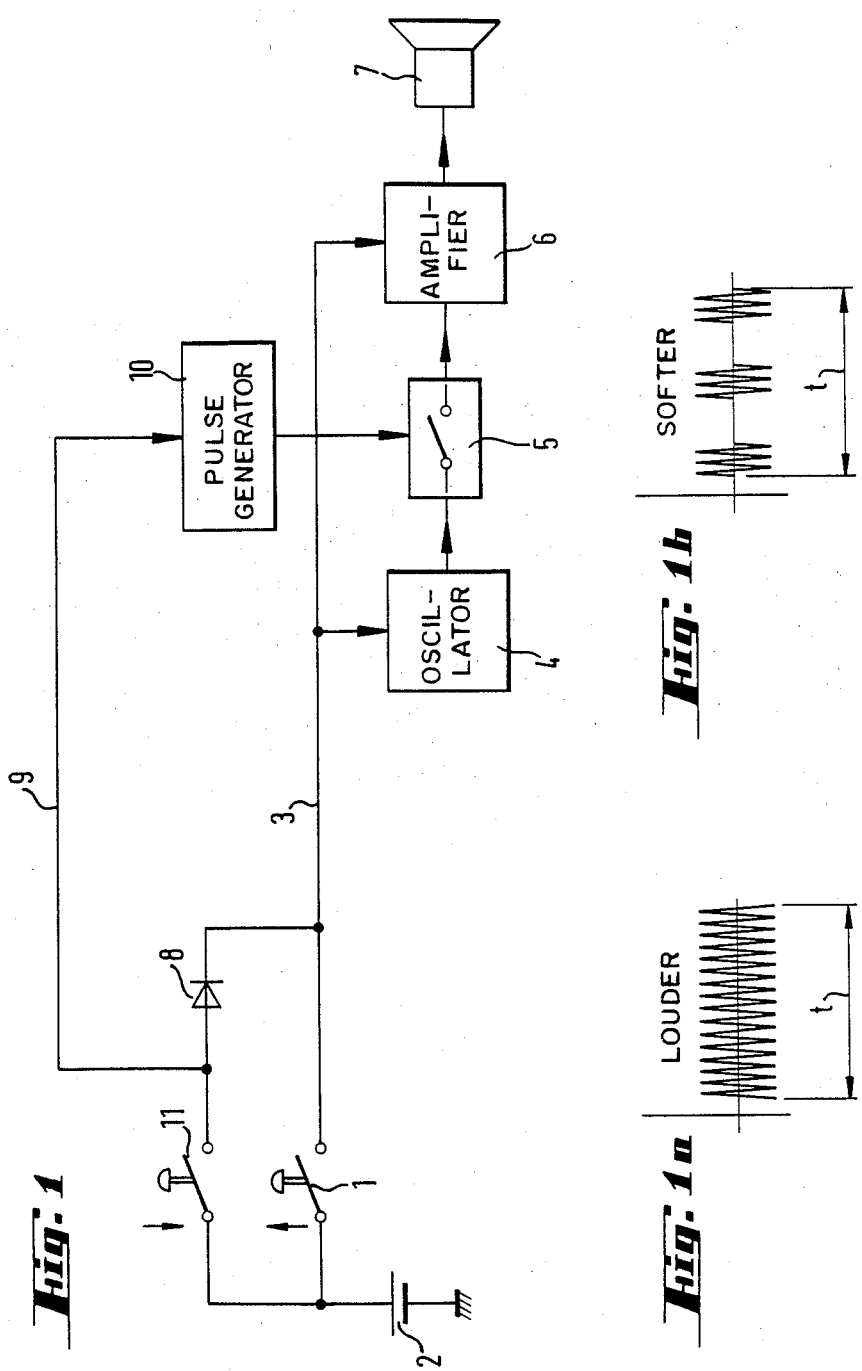
FIGS. 1a and 1b illustrate control signal trains which may be generated by the emitter.

Referring now to the drawing and first to the circuit diagram of the remote sound wave control signal emitter shown in FIG. 1, there is shown oscillator 4 connected to voltage source 2 by current supply line 3, the supply line supplying the voltage from source 2 to the oscillator upon depression of key 1 in the supply line and the oscillator generating an output voltage of a suitable frequency. Switch 5 in a normally closed state transmits the output voltage of oscillator 4 to sound wave control signal emitter 7, amplifying stage 6 being connected between switch 5 and emitter 7 to amplify the output voltage transmitted to the emitter. The received output voltage from oscillator 4 is emitted by sound emitter 7 to the ambient air in the form of a sound wave control signal train. As long as key 1 remains depressed, the signal is emitted at a constant amplitude.

Further current supply line 9 connects the voltage source to pulse generator 10 upon depression of key 11 in supply line 9, the key-operated pulse generator controlling switch 5 for opening the switch to disconnect sound wave control signal emitter 7 from oscillator 4. Blocking diode 8 connected between supply lines 3 and 9 prevents the current from flowing from line 3 to line 9 whereby pulse generator 10 would be operated. But when key 11 is depressed, current flows from voltage source 2 not only through supply line 9 to pulse generator 10, which operates switch 5 and periodically opens and closes it, but also through the now conductive diode 8 through line 3 to oscillator 4. The opening and closing of switch 5 by pulse generator 10 causes sound wave control signal emitter 7 to emit a pulsed control signal as long as key 11 remains depressed.

Figure 1B:
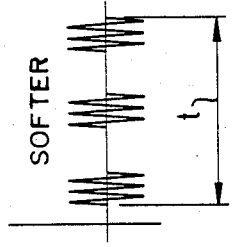
Figure 1A:
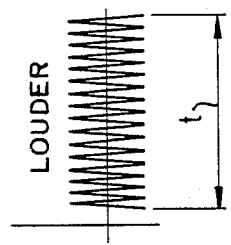

FIG. 1a schematically shows the control signal train during time interval t when key 1 is depressed. As will be explained hereinafter, this control signal is recognized, for example, as command information "louder" by the sound level adjustment circuit component of the hearing aid. The pulsed control signal obtained by depressing key 11 and schematically shown in FIG. 1b, on the other hand, is recognized as command information "softer".

The illustrated remote control signal emitter including oscillator 4, switch 5 and key-operated pulse generator 10 for controlling the switch constitutes only one possible embodiment. In another embodiment, the pulsed control signal shown in FIG. 1b may be obtained by replacing pulse generator 10 by a counter circuit connected to oscillator 4 to stop operation of oscillator 4 after a counted number of oscillations for a given time interval before operating the oscillator again, and this cycle is repeated. Depending on whether key 1 or key 11 is depressed, the counter circuit is or is not operated, and emitter 7 emits a control signal train according to FIGS. 1a or 1b. Suitable integrated circuits including an oscillator and a counter are available in commerce. Remote control signal emitters with such an integrated circuit are particularly simple. Oscillators transmitting their output signals to the sound wave control signal emitter provide a very simple structure. When a key-operated pulse generator controls the switch connecting the oscillator to the sound emitter or loudspeaker, the control of the sound level may be obtained very simply by depressing the key. For example, if key 1 remains depressed, a permanent control signal emitted by emitter 7 will adjust the sound level of the hearing aid to "louder" and the key-operated pulse generator 10 will produce a pulse-modulated emitter signal recognized as command information "softer" by the hearing aid sound level adjustment circuit component.

It is also possible to switch the oscillator between two different operating frequencies or to connect the sound wave control signal emitter to the oscillator through a frequency or amplitude modulator whose degree of modulation may preferably be changed in two stages. In both instances, the transmitted information may be obtained by a demodulator connected to the output of the frequency-selective circuit component of the amplifying circuit of the hearing aid and transmitted to the sound level adjustment circuit component.

In principle, any suitable demodulator circuit may be used for decoding the control signals received by the hearing aid circuit, for example digital filters or a counting discriminator.

The circuit diagram of FIG. 2 schematically illustrates a hearing aid whose sound level adjustment is remote controlled by the sound wave control signal emitter of FIG. 1 and which has an integrated receiver of the emitted control signals for adjustment of the sound level. The illustrated hearing aid comprises microphone 12. The input of the microphone receives not only the speech noise from the environment but also the sound wave control signal from the emitter whose emitted sound waves are in the range of the hearing aid microphone input. According to a preferred feature of the invention, the control signal emitter emits a carrier frequency outside the receiving range of hearing aid earphone 18, preferably above the receiving range of the earphone. In such an arrangement, the control signals required to adjust the sound level are not audible in the hearing aid earphone and if the carrier frequency of the control signal is above the receiving range of the earphone, there is a sharp separation without substantially complicating the circuitry.

The amplifying circuit connected to the microphone output of the hearing aid includes a frequency-selective circuit component constituted in the illustrated embodiment by a separator for the mixture of signals received and transmitted by microphone 12, the signal separator comprising high-pass filter 14 and low-pass filter 15. The illustrated amplifying circuit further includes preamplifier 13 between the microphone output and the frequency-selective circuit component for amplifying the signal mixture transmitted by the microphone to the frequency-selective circuit component. The speech noise signal is transmitted by low-pass filter 15 to sound level adjustment circuit component 16 which transmits the adjusted sound level to amplifying output stage 17 and connected earphone 18. The hearing aid components 16, 17, 18 are of conventional structure and may comprise additional and non-illustrated adjustments for limiting the output sound pressure or for influencing the tone of the sound.

The control sound signal received from remote control sound wave emitter 7 by microphone 12 and amplified at 13 is transmitted by high-pass filter 14 to rectifier 19 whose output is connected to envelope curve detector 20 for transmitting either a continuous or a pulsating direct voltage to detector 20, depending on whether key 1 or 11 in the remote control is depressed. Pulse generator 21 is connected to envelope curve detector 20, the timing rate produced by the pulse generator preferably being 0.3 to 1 second. Detector 20 recognizes and differentiates between a continuous and pulsating input signal received from high-pass filter 14 and rectifier 19 and correspondingly delivers a selected output pulse through output lines A or B to 4-bit counter 22. Depending on whether the output pulses are received by the counter from line A or B, the counter counts the received pulses forwards or backwards, generating a corresponding bit pattern at outputs Q1 to Q4 of the counter. Respective resistor networks R1 to R4 connect respective counter outputs Q1 to Q4 to sound level adjustment circuit 16. The resistors are so selected that they influence sound level adjustment circuit component 16 so as to amplify the hearing aid signal train by steps of 3 db/6 db/12 db/24 db. Depending on the bit pattern at the counter output, each resistor network may be connected alone or in combination with others so that the entire range of adjustment comprises 45 db in 3 db-steps. If this adjustment range is not sufficient (for example in highly-amplified instruments), additional trimmer resistor 23 may be connected between low-pass filter 15 and sound level adjustment circuit component 16 to provide a permanent adjustment of the hearing aid to the hearing loss experienced by the individual using the hearing aid. This resistor is not accessible to the wearer of the hearing aid.

If the counter, which also serves as memory for the sound level command information, is a C-MOS device, the "state of the counter" may be obtained without difficulty and with minimal current even when the hearing aid is turned off. The memory may be a digital latch forming part of the counter and is permanently connected to the battery. In this manner, the selected sound level is permanently set and the circuit need not be adjusted by repeated control signals. After it has been turned on again, the hearing aid will reproduce sound at the previously adjusted level. It would also be possible to use an EEPROM (electrically erasable programmable read-only memory) or "non-volatile" RAM as memory for the sound level command information, which enables the memory to operate without a battery. In principle, the memory also may be an analog circuit, for example it may be comprised of a condenser as a memory element and a field effect transistor operating as a controlled resistor.

FIG. 4 shows the circuit of a signal emitter which may be switched over to generate two different frequencies. When key 1 is depressed, the voltage is delivered from voltage source 2 through diode 8a to current delivery line 9 whereby oscillator 4 and amplifying output stage 6 receive current. The amplifying output stage delivers its output signal to sound emitter 7.

Oscillator 4 may be a voltage-controlled oscillator (VCO) with two control inputs f1 and f2. Depending on which input is activated, the oscillator oscillates at a low frequency f1 (FIG. 4a) or a high frequency f2 (FIG. 4b). When key 1 is depressed, f2 is activated and diode 8 prevents current flow to f1. When key 11 is depressed, f1 is activated and the current delivery line receives current through diode 8 while diode 8a prevents activation of f2.

The signal emitter circuit of FIG. 4 may be used in the hearing aid circuit of FIG. 2, except that rectifier 19 and pulse generator 21 are omitted and envelope curve detector 20 is replaced by a PLL-tone detector. This is a conventionally operating frequency-selective module based on the phase locked-loop principle, such as a module of type NE 567 (Signetics, Exar). The PLL-tone detector delivers pulses corresponding to the previously timed signals of different frequency to lines A and B whereby the 4-bit counter changes the amplification of the hearing aid circuit in the previously described manner.

FIG. 5 illustrates a circuit for a signal emitter with reversible modulation, for example amplitude modulation. The circuit is substantially identical with that of FIG. 4 and the same reference numerals designate the same parts functioning in a like manner. However, the modulation frequencies fmod 1 and fmod 2 delivered by oscillator 4 are not send directly to amplifying output stage 6 but they modulate carrier frequency oscillator 25 which generates a frequency higher than fmod 1 and fmod 2. A modulated carrier frequency signal is now available at the output of oscillator 25 and the input of amplifying output stage 6 for emission to sound emitter 7. FIG. 5a schematically shows low modulation frequency fmod 1 and FIG. 5c shows the carrier modulated thereby. FIGS. 5b and 5d correspondingly illustrate the operation of high modulation frequency fmod 2. While an amplitude-modulated signal emitter has been described, the same principle applies to frequency and pulse modulation.

Figure 6:
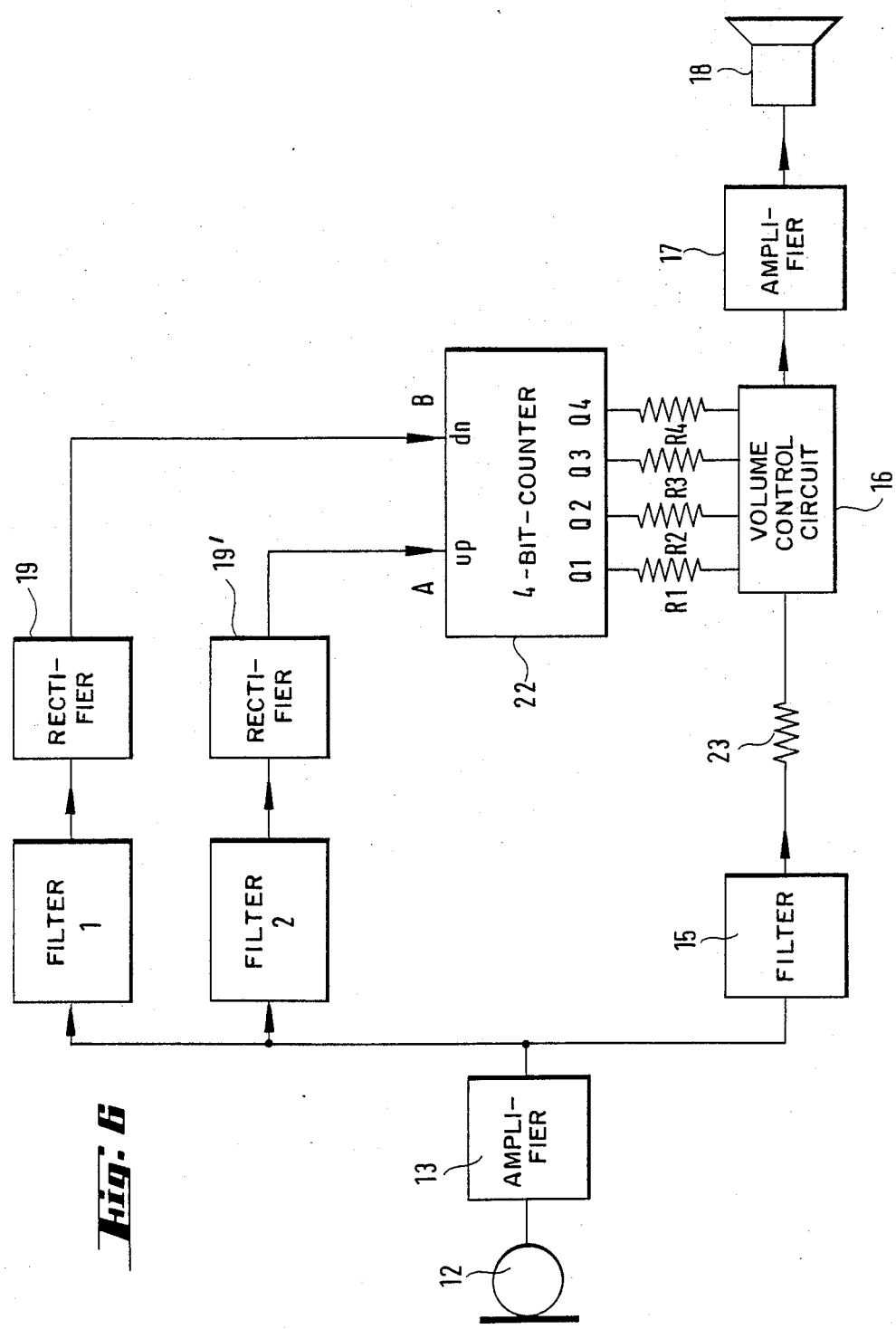
FIG. 6 shows an embodiment of a hearing aid with digital filters for recognizing signals.

FIG. 6 schematically illustrates a hearing aid with digital filters for recognizing signals. The signal is divided after pre-amplifier 13 in the receiver in the hearing aid part proper whose sound level controlled by the command information signal through a frequency-selective circuit (low-pass filter 15), as has been described in connection with FIG. 2. The command signal is delivered to two digital filters (filter 1/filter 2) which recognize the delivered information ("lower" or "higher" sound level) and deliver corresponding control voltage A or B through rectifiers 19, 19' to counter 22. Since the two filters are themselves frequency-selective, high-pass filter 14 of the embodiment of FIG. 2 is omitted.

Figure 7:
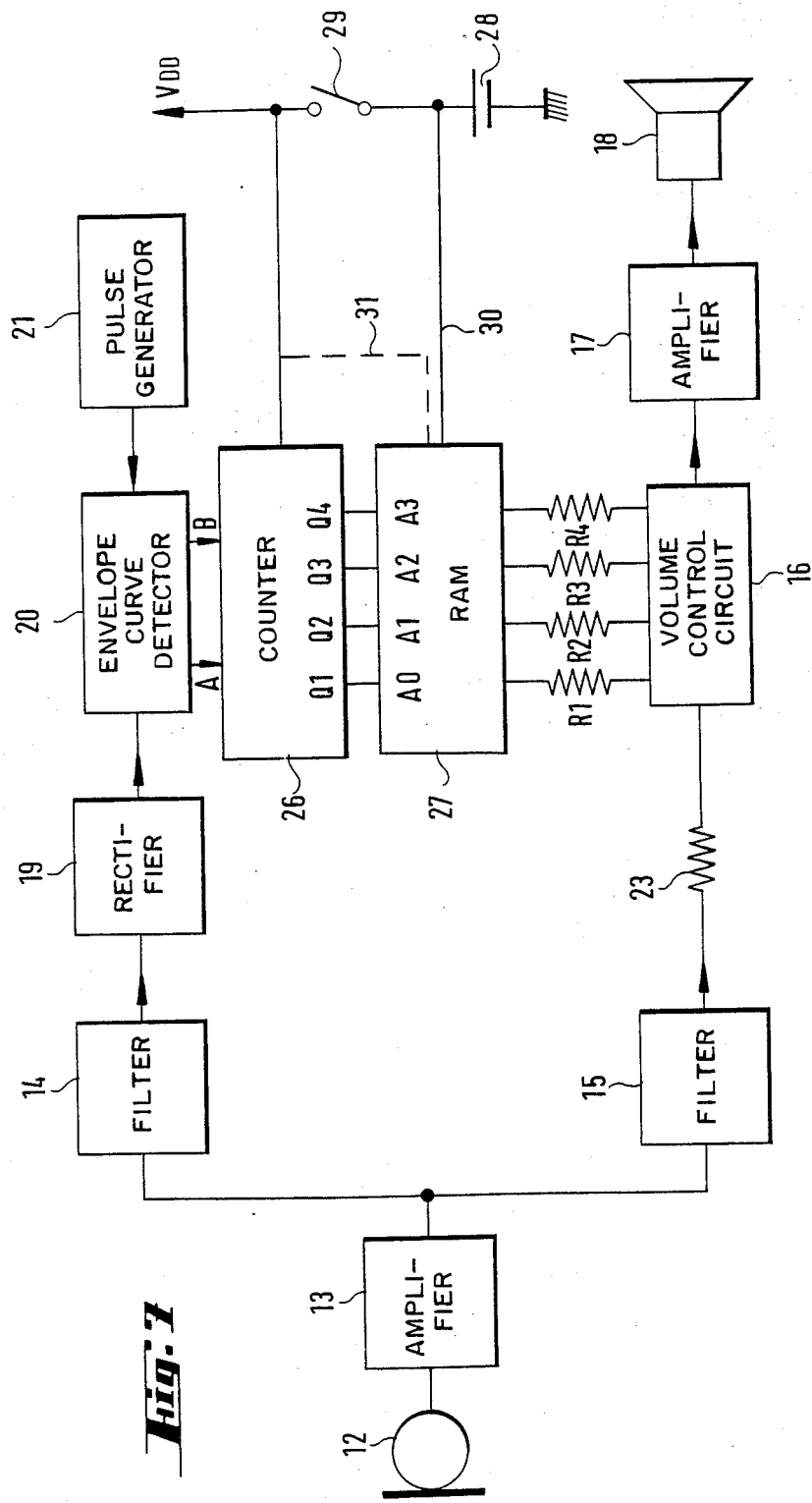
FIG. 7 shows an embodiment with a digital memory for the adjusted sound level information.

FIG. 7 illustrates an embodiment of a separate digital memory for the adjusted sound level command information. The sound level command information A/B is obtained in the manner described in connection with FIG. 2. Signals A and B again have the effect that counter 26 counts forwards or backwards. The state of the counter is read as 4-bit information into memory 27, which retains the same and influences the amplification of the hearing aid through resistors R1 . . . R4 and sound level adjustment circuit 16. The receiver receives current from current source 28 which is connected to counter 26 and the other circuit modules (connection $V_{DD}$) by on-off switch 29. If memory 27 is a "normal" C-MOS-RAM, it is permanently powered from the battery by connecting line 30 but if it is an EEPROM, it may be connected by line 31 (shown in broken line) to the circuit current source since it requires no voltage during operational interruptions to retain the information in the memory.

Figure 8:
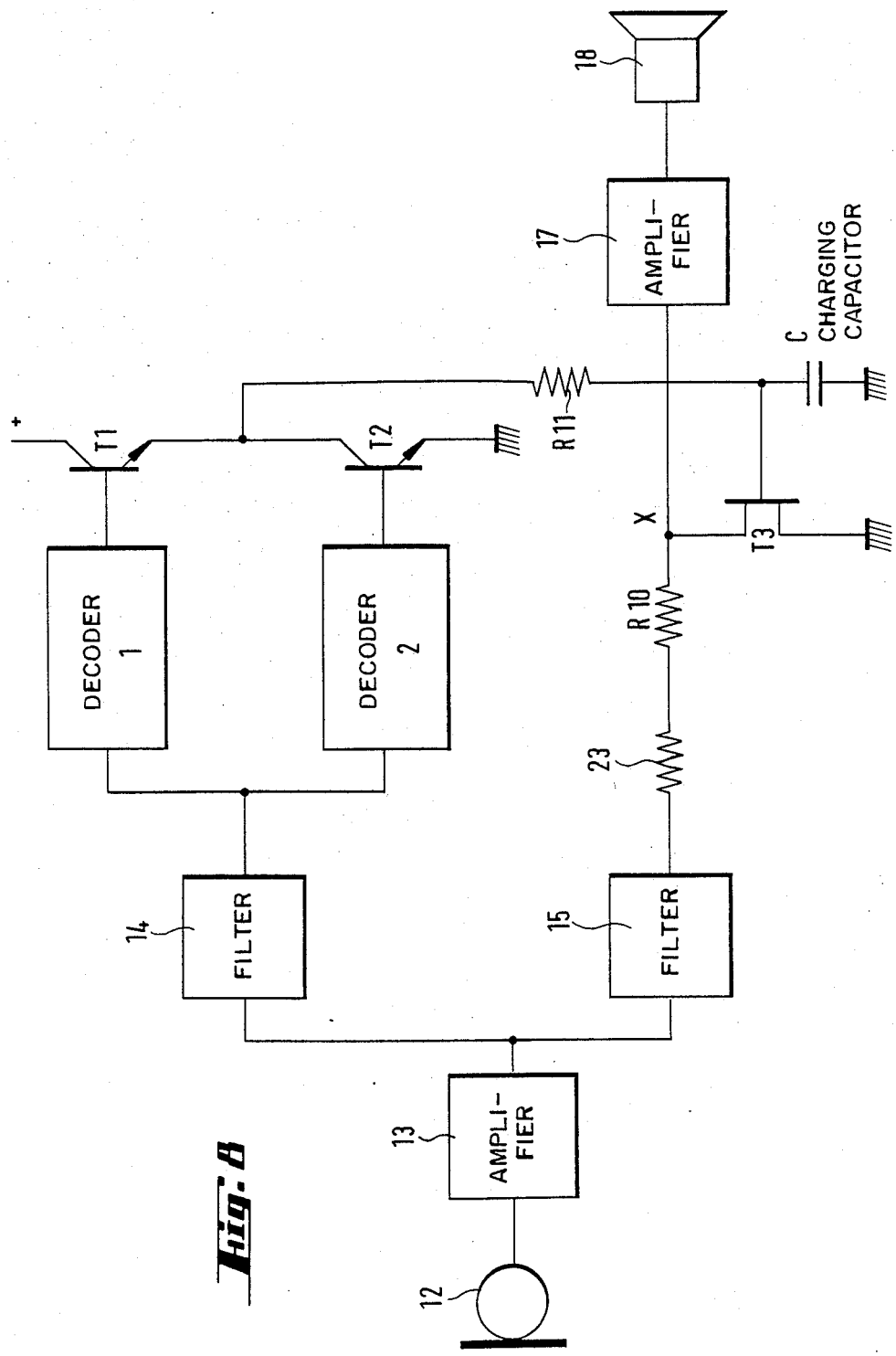
FIG. 8 shows an embodiment of an analog circuit of the receiver component of the hearing aid.

FIG. 8 illustrates an embodiment of an analog circuit of the receiver part of the in-ear hearing aid. The receiver again comprises microphone 12 and pre-amplifier 13 after which the signal path is divided. The information signal component is received through low-pass filter 15 and trimmer 23 for the coarse adjustment of the sound level by a controlled voltage divider comprised of longitudinal resistor R10 and field effect transistor T3 operating as a controlled transverse resistor. The NF-voltage at discharge point X of the voltage divider will normally be further used in amplifying output stage 17 and the hearing aid.

The control signal component is delivered by high-pass filter 14 to two decoders 1, 2 which recognize the control signals coming from the signal emitter and generate a corresponding output signal. If the output of decoder 1 "high", transistor T1 becomes conductive and charges memory condenser C through resistor R11. The increasing voltage at C causes the gate-connection of T3 to become more positive and T3 becomes conductive. This causes the NF-voltage at point X to become smaller, i.e. to produce a lower sound level. If the output of decoder 1 is "low" and the output of decoder 2 is "high", transistor T2 becomes conductive and condenser C is discharged through T2. The reduced voltage at condenser C and the gate-connection of T3 makes it highly resistant, causing the NF-voltage at point X to increase, i.e. to produce a louder sound level. If no control signal information is delivered, both decoder outputs are "low" and T1 and T2 are blocked so that the charge of condenser C cannot change. In this way, T3 also has a constant resistance and the adjusted sound level cannot change.

What is claimed is:

1. In combination:
   (a) a hearing aid to be worn on the head of a hard-of-hearing person comprising
      (1) a microphone in the hearing aid having an input and an output for respectively receiving and transmitting a range of sound wave signals comprising speech signals and control signals,
      (2) a battery-operated earphone in the hearing aid having an input for receiving the range of sound wave signals transmitted by the microphone, and
      (3) an amplifying circuit in the hearing aid connecting the microphone output to the earphone input, the amplifying circuit including a frequency-selective circuit component comprising a high-pass filter and a low-pass filter to divide the speech signals from the control signals and a sound level adjustment circuit component for the speech signal connected to the frequency-selective circuit component;
   (b) a memory for the adjusted sound level connected to the sound level adjustment circuit component for controlling the sound level to store the adjusted sound level; and
   (c) a remote sound wave control signal emitter circuit separate from the hearing aid and emitting sound wave control signals within the frequency range of the microphone input.

2. The combination of claim 1, wherein the amplifying circuit includes a pre-amplifier between the microphone output and the frequency-selective circuit component.

3. The combination of claim 1, wherein the sound wave control signal emitter circuit emits a carrier frequency outside the receiving range of the hearing aid earphone input.

4. The combination of claim 3, wherein the emitted carrier frequency is above the receiving range of the earphone input.

5. The combination of claim 1, wherein the separate sound wave control signal emitter circuit comprises an oscillator having an output and a sound wave control signal emitter connected thereto.

6. The combination of claim 5, further including a switch connecting the oscillator output to the sound emitter in a normally closed state and a key-operated pulse generator controlling the switch by periodically opening the switch to disconnect the sound emitter from the oscillator output.

7. The combination of claim 5, wherein the oscillator may be switched to generate two different operating frequencies.

8. The combination of claim 5, wherein the output of the oscillator emits a frequency-modulated signal.

9. The combination of claim 5, wherein the output of the oscillator emits an amplitude-modulated signal.

10. The combination of claim 1, wherein the frequency-selective circuit component has an output connected to an envelope curve detector, and further comprising a pulse generator connected to the envelope curve detector.

11. The combination of claim 10, further comprising a counter having an input connected to an output of the envelope curve detector for receiving output signals therefrom, the counter counting forwards or backwards in dependence on the received output signals, and a resistor network connected between the counter and the sound level adjustment circuit component for adjusting the sound level in response to the counter count.

12. The combination of claim 1, wherein an output of the frequency-selective circuit component is connected to a digital filter for decoding the signals emitted by the wave emitter.

13. The combination of claim 1, wherein an output of the frequency-selective circuit component is connected to a decoding circuit for decoding the signals emitted by the sound wave control signal emitter.

14. The combination of claim 1, wherein the memory is a digital circuit permanently connected to the battery.

15. The combination of claim 14, wherein the digital circuit is a counter.

16. The combination of claim 1, wherein the memory is a non-volatile digital memory.

17. The combination of claim 1, wherein the memory is an analog circuit.

* * * * *